(12) United States Patent
Annunziata et al.

(10) Patent No.: US 9,397,287 B1
(45) Date of Patent: Jul. 19, 2016

(54) MAGNETIC TUNNEL JUNCTION WITH POST-DEPOSITION HYDROGENATION

(71) Applicant: International Business Machines Corporation, Armonk, NY (US)

(72) Inventors: Anthony J. Annunziata, Stamford, CT (US); Chandrasekharan Kothandaraman, New York, NY (US); Gen P. Lauer, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/982,967

(22) Filed: Dec. 29, 2015

(51) Int. Cl.
H01L 43/08 (2006.01)
H01L 43/02 (2006.01)
G11C 11/16 (2006.01)
H01L 43/12 (2006.01)

(52) U.S. Cl.
CPC .............. *H01L 43/08* (2013.01); *G11C 11/161* (2013.01); *H01L 43/02* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 4,642,795 A | * | 2/1987 | Tamada | G11B 5/00 365/10 |
| 6,841,484 B2 | | 1/2005 | Ying et al. | |
| 2006/0240992 A1 | * | 10/2006 | Brandt | B82Y 25/00 600/410 |

FOREIGN PATENT DOCUMENTS

JP 10270776 A * 10/1998

OTHER PUBLICATIONS

Ando, T. et al, "Origins of Effective Work Function Roll-Off Behavior for High-k Last Replacement Metal Gate Stacks", IEEE Electron Devices Letters, Jun. 2013, pp. 729-731, vol. 34, No. 6.
Ando, T., "Ultimate Scaling of High-k Gate Dielectrics: Higher-k or Interfacial Layer Scavenging?", Materials, 2012, pp. 478-500, vol. 5.
Anthony J. Annunziata, "Enhancement of Spin Transfer Torque Magnetoresistive Random Access Memory Device Using Hydrogen Plasma", U.S. Appl. No. 14/982,986, filed Dec. 29, 2015.
Anthony J. Annunziata, "Low Degradation MRAM Encapsulation Process Using Silicon-Rich Silicon Nitride Film", U.S. Appl. No. 14/983,015, filed Dec. 29, 2015.

(Continued)

*Primary Examiner* — Joseph Schoenholtz
(74) *Attorney, Agent, or Firm* — Cantor Colburn LLP; Vazken Alexanian

(57) ABSTRACT

According to an embodiment of the invention, a method of making a magnetic random access memory device includes: forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; depositing an encapsulating layer on and along sidewalls of the magnetic tunnel junction; depositing an interlayer dielectric layer on the encapsulating layer disposed on the magnetic tunnel junction; annealing the magnetic tunnel junction; and implanting hydrogen in a portion of the magnetic tunnel junction. According to another embodiment of the invention, implanting of hydrogen in a portion of the magnetic tunnel junction occurs after forming a magnetic tunnel junction trench. An MRAM device with hydrogen atoms incorporated in a portion of the magnetic tunnel junction is also disclosed.

20 Claims, 8 Drawing Sheets

(56) References Cited

OTHER PUBLICATIONS

Cartier, E. et al, "Fundamental Aspects of HfO-2based High-k Metal Gate Stack Reliability and Implications on tinv-Scaling", Electron Devices Meeting, Dec. 2011, pp. 18.4.1-18.4.4.

Chen, P. et al., "Effects of Hydrogen Implantation Temperature on InP Surface Blistering" Appl. Phys. Lett. 92; 202107 (2008) doi:10.1063/1.2926682; pp. 1-3.

Jeong, J. et al, "Improvement of Electric and Magnetic Properties of Patterned Magnetic Tunnel Junctons by Recovery of Damaged Layer Using Oxygen Showering Post-treatment Process", Journal of Applied Physics, 2015, vol. 117; pp. 1-5.

Jeong, J. et al, "Influence of Hydrogen Patterning Gas on Electric and Magnetic Properties of Perpendicular Magnetic Tunnel Junctions" Journal of Applied Physics, 2014, vol. 115, pp. 1-4.

List of IBM Patents or Patent Applications Treated as Related: YOR920151122US1; Date Filed: Dec. 29, 2015; pp. 1-2.

\* cited by examiner

“MAGNETIC TUNNEL JUNCTION WITH POST-DEPOSITION HYDROGENATION”

BACKGROUND

The present invention relates to spin-transfer torque magnetoresistive random access memory (STT-MRAM devices), and more specifically, to incorporation of hydrogen in stack structures of spin-transfer torque magnetoresistive random access memory devices using hydrogen implantation after encapsulation and annealing of the stack.

Spin-transfer torque magnetoresistive random access memory devices have some benefits over semiconductor-based memories, such as dynamic random-access memory (DRAM) and static random-access memory (SRAM). However, in order to compete with dynamic random-access memory and static random-access memory, the spin-transfer torque magnetoresistive random access memory devices are integrated into the wiring layers of standard silicon logic and memory chips.

Spin-transfer torque magnetoresistive random access memory device is a type of solid state, non-volatile memory that uses tunneling magnetoresistance (TMR or MR) to store information. Magnetoresistive random access memory (MRAM) includes an electrically connected array of magnetoresistive memory elements, referred to as magnetic tunnel junctions (MTJs). Each magnetic tunnel junction includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

A magnetic tunnel junction stores information by switching the magnetization state of the free layer. When magnetization direction of the free layer is parallel to the magnetization direction of the reference layer, the magnetic tunnel junction is in a low resistance state. Conversely, when the magnetization direction of the free layer is antiparallel to the magnetization direction of the reference layer, the magnetic tunnel junction is in a high resistance state. The difference in resistance of the MTJ may be used to indicate a logical '1' or '0', thereby storing a bit of information. The tunneling magnetoresistance of a magnetic tunnel junction determines the difference in resistance between the high and low resistance states. A relatively high difference between the high and low resistance states facilitates read operations in the MRAM.

SUMMARY

According to an embodiment of the invention, a method of making a magnetic random access memory device includes: forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; depositing an encapsulating layer on and along sidewalls of the magnetic tunnel junction; depositing an interlayer dielectric layer on the encapsulating layer disposed on the magnetic tunnel junction; annealing the magnetic tunnel junction; and implanting hydrogen in a portion of the magnetic tunnel junction.

According to another embodiment of the invention, a magnetic random access memory device, the method comprising: forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; depositing an encapsulating layer on and along sidewalls of the magnetic tunnel junction; depositing an interlayer dielectric layer on the encapsulating layer disposed on the magnetic tunnel junction; annealing the magnetic tunnel junction; forming a trench through a portion of the encapsulating layer and dielectric layer, said trench exposing a portion of the free layer; and implanting hydrogen in a portion of the magnetic tunnel junction after forming the trench.

According to yet another embodiment of the invention, an MRAM device includes: a magnetic tunnel junction arranged on an electrode, the magnetic tunnel junction comprising a reference layer positioned in contact with the electrode, a tunnel barrier layer arranged on the reference layer, and a free layer arranged on the tunnel barrier layer; an encapsulating layer disposed on and along sidewalls of the magnetic tunnel junction; and an interlayer dielectric layer disposed on the encapsulating layer; wherein hydrogen atoms are incorporated in a portion of the magnetic tunnel at a concentration range from about 10 ppm to about 10% based on the total number of atoms in the magnetic tunnel junction.

BRIEF DESCRIPTION OF THE DRAWINGS

The subject matter, which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-6 illustrate exemplary methods of making MRAM devices according to various embodiments, in which:

FIG. 1 is a cross-sectional side view of a patterned magnetic tunnel junction stack positioned on a contact electrode;

FIG. 2 is a cross-sectional side view after depositing an encapsulating layer on the magnetic tunnel junction stack;

FIG. 3 is a cross-sectional side view after depositing an interlayer dielectric layer on the encapsulated magnetic tunnel junction stack;

FIG. 4 is a cross-sectional side view of hydrogen implantation after depositing an interlayer dielectric layer on the encapsulated magnetic tunnel junction stack;

FIG. 5 is a cross-sectional side view after creating a magnetic tunnel junction trench; and FIG. 6 is a cross-sectional side view of hydrogen implantation after creating a magnetic tunnel junction trench;

DETAILED DESCRIPTION

Figure 1:
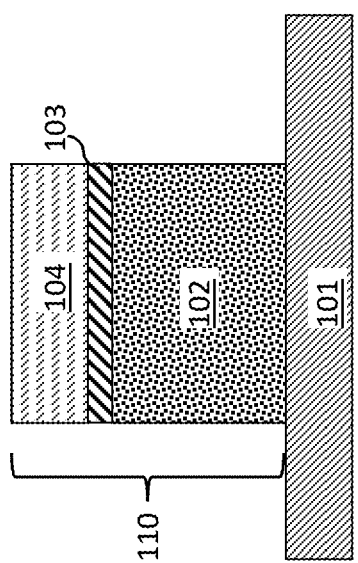

One challenge of improving electronic devices is increasing memory capacity without increasing size. This can be accomplished by building memory storage components with more memory packed into the same space. However, smaller memory devices may have poorer data retention.

Data retention in MRAM devices is proportional to coercive field (Hc) and area. As a device gets smaller, Hc should increase in order to maintain data retention, but in fact Hc tends to decrease as the device becomes smaller. A method of maintaining Hc or minimizing Hc loss at smaller device size would allow smaller devices with minimal loss in data retention.

It has been unexpectedly discovered that treatment of a magnetic tunnel junction stack with hydrogen plasma produces a treated magnetic tunnel junction stack with higher coercive field than without the hydrogen plasma treatment.

Various embodiments herein describe new processes to treat the magnetic tunnel junction with hydrogen, said processes including hydrogen implantation after encapsulation, deposition, and annealing. The magnetic tunnel junction treated with hydrogen implantation will have higher coercive field than devices made without the hydrogen implantation treatment. This higher coercive field magnetic tunnel junction can be incorporated in smaller MRAM devices, for example spin-transfer torque magnetoresistive random access memory devices, with improved data retention.

Another challenge of integrating spin-transfer torque magnetoresistive random access memory devices into the wiring layers of silicon logic and memory chips is encapsulating the spin-transfer torque magnetoresistive random access memory device after patterning. The spin-transfer torque magnetoresistive random access memory device including a magnetic tunnel junction is encapsulated so that the magnetic layers and tunnel barrier layer experience minimal degradation during subsequent processing. Encapsulation of the MRAM device can protect the magnetic tunnel junction during subsequent processing.

Accordingly, various embodiments provide methods of making a MRAM device comprising treating magnetic tunnel junction stacks with hydrogen implantation. The hydrogen implantation can be performed after the magnetic tunnel junction has been processed by encapsulation, interlayer dielectric layer deposition, and annealing. In some embodiments, the hydrogen implantation can be performed after magnetic tunnel junction trench formation.

The embodiments provide methods of encapsulating devices for perpendicularly magnetized spin-transfer torque magnetoresistive random access memory that use physically deposited silicon nitride or aluminum oxide. Encapsulation can be performed by chemical vapor deposition (CVD) encapsulating methods, physical vapor deposition (PVD) methods, plasma enhanced chemical vapor deposition (PECVD) methods, and the like. The disclosed processes improve device characteristics and reduce magnetic degradation at small device diameters (e.g., <50 nm).

Turning now to the Figures, FIGS. 1-6 illustrate exemplary methods of making MRAM devices according to various embodiments. FIG. 1 is a cross-sectional side view of a patterned magnetic tunnel junction stack 110 positioned on a contact electrode 101. The magnetic tunnel junction stack 110 includes a reference layer 102, a tunnel barrier layer 103, and a free layer 104.

The contact electrode 101 includes a conductive material(s) and forms the bottom contact electrode of the MRAM device. Non-limiting examples of conductive materials for the contact electrode include tantalum, tantalum nitride, titanium, or any combination thereof.

The contact electrode 101 may be formed by depositing a conductive material(s) onto a surface. The conductive material(s) may be deposited by, for example, physical vapor deposition (PVD), ion beam deposition (IBD), atomic layer deposition (ALD), electroplating, or other like processes.

To form the magnetic tunnel junction stack 110, the reference layer 102 is formed on the contact electrode 101; the tunnel barrier layer 103 is formed on the reference layer 102; and the free layer 104 is formed on the tunnel barrier layer 103.

The reference layer 102 and the free layer 104 include conductive, magnetic materials, for example, metals or metal alloys. The reference layer 102 and the free layer 104 may be formed by employing a deposition process, for example, PVD, IBD, ALD, electroplating, or other like processes.

The reference layer 102 and the free layer 104 may include one layer or multiple layers. The reference layer 102 and the free layer 104 may include the same materials and/or layers or different materials and/or layers.

Non-limiting examples of materials for the reference layer 102 and/or the free layer 104 include iron, cobalt, boron, aluminum, nickel, silicon, oxygen, carbon, zinc, beryllium, vanadium, boron, magnesium, or any combination thereof.

The reference layer 102 has a thickness that may generally vary and is not intended to be limited. In some embodiments, the reference layer 102 has a thickness in a range from about 10 to about 25 nm. In other embodiments, the reference layer 102 has a thickness in a range from about 2 to about 10 nm.

The free layer 104 has a thickness that may generally vary and is not intended to be limited. In some embodiments, the free layer 104 has a thickness in a range from about 2 to about 5 nm. In other embodiments, the free layer 104 has a thickness in a range from about 1 to about 2 nm.

The tunnel barrier layer 103 includes a non-magnetic, insulating material. A non-limiting example of an insulating material for the tunnel barrier layer 103 is magnesium oxide (MgO). The tunnel barrier layer 103 may be formed on the reference layer 102 by, for example, radiofrequency (RF) sputtering in some embodiments. Alternatively, the tunnel barrier layer 103 is formed by oxidation (e.g., natural or radical oxidation) of a magnesium (Mg) layer deposited on the reference layer 102. After oxidation, the MgO layer may then be capped with a second layer of Mg. The thickness of the tunnel barrier layer 103 is not intended to be limited and may generally vary.

After depositing the magnetic tunnel junction stack 110 layers on the contact electrode 101, the magnetic tunnel junction stack 110 is patterned. In some embodiments, a hard mask material layer may be disposed on the magnetic tunnel junction stack 110. The hard mask material layer is then patterned by etching, for example, using a reactive ion etch (ME) process or a halogen-based chemical etch process (e.g., including chlorine-containing gas and/or fluorine-containing gas chemistry). The pattern from the hard mask is transferred into the free layer 104, tunnel barrier layer 103, and reference layer 101. The free layer 104, tunnel barrier layer 103, and reference layer 102 are etched by, for example, performing a MRAM stack etch process. The stack etch process may be a RIE process or an ion beam etch (IBE) process.

Figure 2:
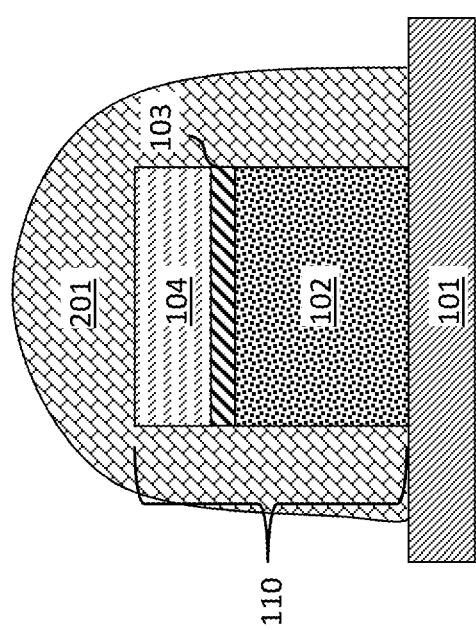

FIG. 2 is a cross-sectional side view after depositing an encapsulating layer 201 on the magnetic tunnel junction stack 110. The encapsulating layer 201 includes one or more insulating materials. The insulating layer 201 encapsulates the magnetic tunnel junction stack 110. The encapsulating layer 201 is deposited on the exposed surface and sidewalls of the magnetic tunnel junction stack 110 and contacts the contact electrode 101.

The thickness of the encapsulating layer 201 may generally vary and is not intended to be limited. In some embodiments, the thickness of the encapsulating layer 201 is in a range from about 10 to about 60 nm. In other embodiments, the thickness of the encapsulating layer 201 is in a range from about 2 to about 10 nm. To achieve a desired encapsulating layer thickness of, for example, silicon nitride, several cycles of deposition may be performed. To achieve a desired encapsulating layer thickness of, for example, aluminum oxide, several cycles of deposition and oxidation may be performed.

The encapsulating layer 201 may be deposited by methods such as chemical vapor deposition (CVD), plasma enhanced chemical vapor deposition (PECVD), physical vapor deposition (PVD), and the like.

In some embodiments, the encapsulating layer 201 can be deposited using a CVD method. The CVD method may be performed at a temperature range from about 50 to about 300° C., or from about 150 to about 200° C.

In some embodiments, the encapsulating layer 201 can be deposited using a PECVD method. The PECVD method may be performed at a temperature range from about 50 to about 300° C., or from about 150 to about 200° C.

In some embodiments, the encapsulating layer 201 can be deposited using a PVD method. The deposition conditions for forming the encapsulating layer 201 using PVD methods includes low sample temperatures (e.g., about room temperature), low power and deposition rates, and slightly reactive plasma. The PVD method may be performed at a temperature range from about 20 to about 25° C., or at room temperature.

The encapsulating layer 201 may include, for example, AlOx or SiNx. Sub-stoichiometric amounts of AlOx and SiNx may be formed using various levels of the appropriate reactive gas ($O_2$ or $N_2$). The encapsulating film 201 may include, for example, $SiN_x$ or $AlO_x$, wherein x is the ratio of N to Si and O to Al, respectively, and x may be varied to range from pure elemental Si/Al to stoichiometric $Si_3N_4$ or $Al_2O_3$. In one embodiment, the encapsulating layer 201 includes $SiN_x$, and x is from 0 to 1.33 (i.e., pure Si to $Si_3N_4$). In another embodiment, the encapsulating layer 201 includes $AlO_x$, and x is from 1 to 1.5 (i.e., AlO to $Al_2O_3$). In some embodiments, the encapsulating layer 201 comprises silicon nitride, aluminum oxide, or a combination thereof.

Figure 3:
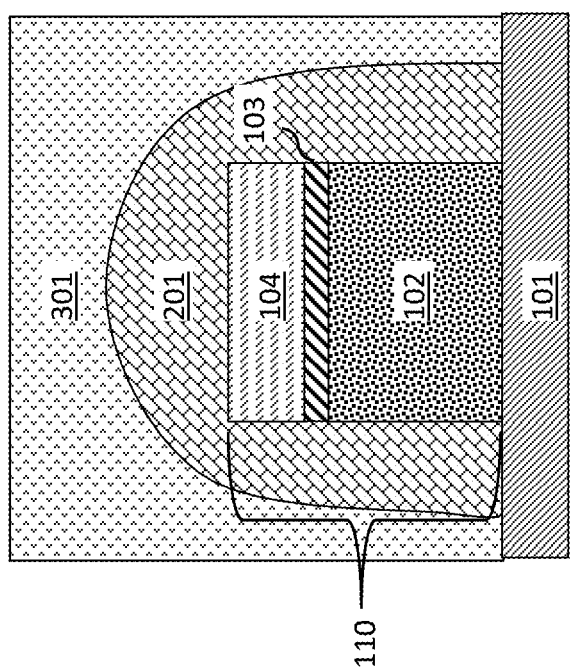

FIG. 3 is a cross-sectional side view after depositing an interlayer dielectric (ILD) layer 301 on the MTJ stack 110. The ILD layer 301 may include, for example, a low-k dielectric oxide, including but not limited to, silicon dioxide, spin-on-glass, a flowable oxide, a high-density plasma oxide, or any combination thereof. The ILD layer 301 may be formed by performing deposition process, including, but not limited to CVD, PVD, plasma enhanced CVD, atomic layer deposition (ALD), evaporation, chemical solution deposition, or like processes.

Figure 4:
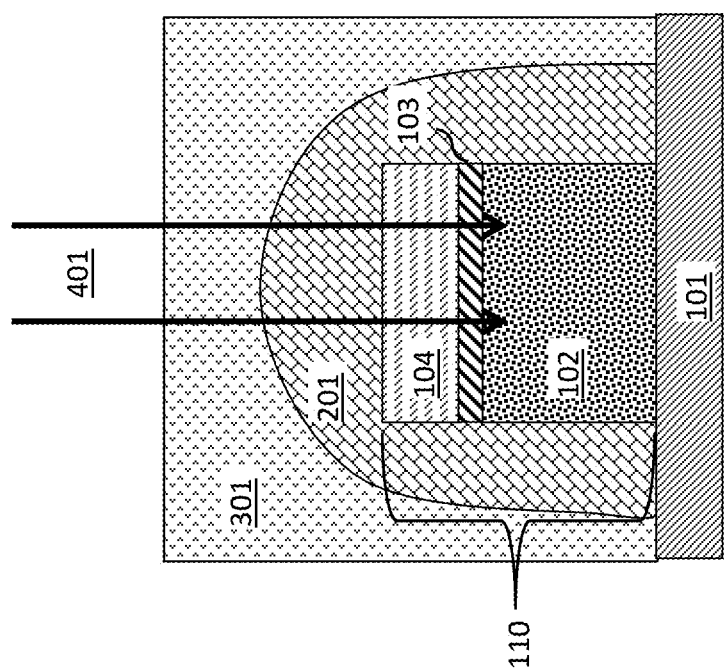

FIG. 4 is a cross-sectional side view of a device after depositing an interlayer dielectric (ILD) layer 301 on the MTJ stack 110, and after annealing. In the figure, the MTJ stack 110 is undergoing hydrogen implantation. The arrows 401 shown in the figure are symbolic representations of the hydrogen implantation penetrating the MTJ stack 110 during the hydrogen implantation treatment.

Annealing means exposing the MRAM device to heat to change its properties. For a magnetic tunnel junction to function well, there needs to be sufficient resistance between the free layer 104 and reference layer 102. If the MRAM device is suitably annealed, the resistance properties of the magnetic tunnel junction can be altered to increase resistance and improve the functioning of the device. In some embodiments, annealing can be performed at a temperature from about 200 to about 500° C., or from about 250 to about 400° C. In some embodiments the time of annealing is from 10 minutes to 3 hours, or from about 30 minutes to about 1.5 hours, and in some embodiments there can be multiple annealing steps. In some embodiments there may be a magnetic field applied to the MRAM device during the annealing process.

Implanting hydrogen is performed by a technique generally known as ion implantation. An ion implantation apparatus consists typically of an ion source, where ions are produced from an input material such as a gas, an accelerator, where the ions are electrostatically accelerated to high energy, and a target chamber where the ions hit the material to be implanted. The ions are accelerated into a beam which is then aimed at the part of the target to be implanted. The depth of penetration of the ions into a solid target is determined by the energy of the ions, the ion species, and the composition of the target. If the desired target surface area is larger than the beam area, the implantation can be evenly distributed by a combination of beam scanning and target motion. Hydrogen implantation uses a beam of hydrogen ions created by an ion implantation apparatus using hydrogen gas as an input material.

Figure 6:
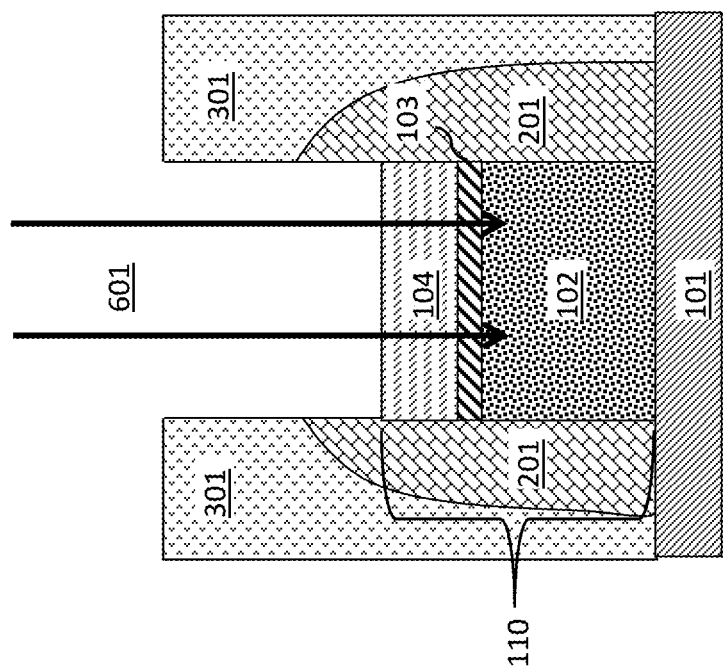

In an embodiment, implanting hydrogen "in the magnetic tunnel junction", means that the beam of hydrogen ions is directed to pass into the structure of the magnetic tunnel junction stack 110. In FIG. 6 the hydrogen implantation beam is shown as arrows 401 passing directly into and substantially perpendicular to the layers of the magnetic tunnel junction stack 110, but other angles of the hydrogen ion beam can be used so long as they allow hydrogen ions to penetrate into the stack. In some embodiments the hydrogen ions penetrate only into free layer 104, in other embodiments, the hydrogen ions penetrate into tunnel barrier layer 103, into reference layer 102, or into a combination of the above mentioned layers. In some embodiments, the hydrogen ions are distributed throughout all the layers into which they have penetrated.

The hydrogen implantation treatment should be performed at a power, temperature, hydrogen dose, and hydrogen dose rate adequate to allow the hydrogen to sufficiently penetrate the magnetic tunnel junction stack, but not so high as to cause damage to the stack. In some embodiments, the hydrogen implantation treatment includes a power in a range from about 25 to about 200 kiloelectronvolts (keV), or from about 50 to about 150 keV, or from about 75 to about 125 keV.

High temperatures could cause damage to the stack, thus it is desired to keep temperatures in a moderate range. In some embodiments, the hydrogen implantation occurs at a temperature range from about −20 to about 250° C., or from about 20 to about 200° C. In some embodiments the implantation occurs at low temperature in a range from about −20 to about 30° C., or at room temperature. In other embodiments the implantation occurs at moderate temperature in a range from about 150 to about 250° C.

As the hydrogen implantation can damage the stack, especially if high temperatures are involved, it is desired to keep the amount or "dose" of hydrogen relatively small. Implantation is performed at a certain hydrogen dose, which is equal to the hydrogen dose rate multiplied by the time of implantation. In some embodiments, the hydrogen implantation occurs at a hydrogen dose from about $1 \times 10^{13}$ to about $1 \times 10^{21}$ cm$^{-2}$, or from about $1 \times 10^{14}$ to about $1 \times 10^{17}$ cm$^{-2}$.

In some embodiments, hydrogen implantation occurs at a hydrogen dose rate from about $1 \times 10^{11}$ to about $1 \times 10^{15}$ or from about $1 \times 10^{12}$ to about $1 \times 10^{14}$ cm$^{-2}$s$^{-1}$.

Without being bound by theory, it is believed the hydrogen implantation allows the penetration of hydrogen atoms into portions of the magnetic tunnel junction stack, and that this penetration results in an increase in the coercivity of the free layer of the MRAM device. The mechanism is unknown, but hydrogen may be incorporated in the magnetic tunnel junction structure, or the hydrogen may react with parts of the magnetic tunnel junction, such as oxygen atoms.

In some embodiments, the hydrogen implantation process includes a pre-treatment comprising an implantation of another type of ion, such as neon ions, before the hydrogen implantation. Without being bound by theory, it is believed that the pre-treatment implantation with certain non-hydrogen ions such as neon ions is able to "pre-engineer" trapping sites for the hydrogen atoms in the subsequent hydrogen implantation, and will allow greater incorporation of hydrogen. Thus, in some embodiments, implanting further comprises implanting with non-hydrogen ions prior to implanting with hydrogen; wherein the non-hydrogen ions can be neon ions.

Hydrogen implantation is preferably formed after annealing, as the temperature during the annealing process can cause loss of some of the implanted hydrogen. In some embodiments, the hydrogen implantation is performed after annealing but before forming a magnetic tunnel junction trench.

Figure 5:
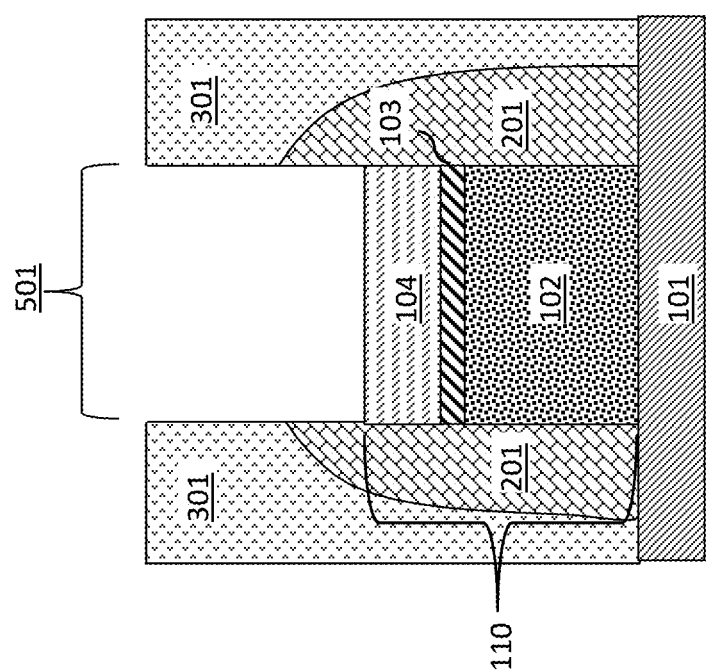

FIG. 5 is a cross-sectional side view of a device after forming a magnetic tunnel junction trench 501 which exposes a portion of the free layer 104.

The magnetic tunnel trench can be formed by a variety of methods, for example by reactive ion etching (RIE).

In some embodiments, the hydrogen implantation is performed after forming the magnetic tunnel junction trench.

FIG. 6 is a cross-sectional side view of a device after forming a magnetic tunnel junction trench 501 which exposes a portion of the free layer 104, with the MTJ stack 110 undergoing a hydrogen implantation process. The arrows 601 shown in the figure are symbolic representations of the hydrogen implantation penetrating the MTJ stack 110 during the hydrogen implantation treatment.

As described above, various embodiments provide methods of hydrogen implantation treatment of devices for perpendicularly magnetized spin-transfer torque magnetoresistive random access memory, followed by encapsulation that uses deposited silicon nitride or aluminum oxide to encapsulate the MRAM device. The silicon nitride or aluminum oxide is deposited after the last magnetic tunnel junction etch patterning step.

In some embodiments the MRAM device made according to the methods above has a coercive field that is higher by at least 20% or more than the coercive field of a similar device made without hydrogen treatment.

In some embodiments the MRAM device made according to the methods above has a spin torque switching efficiency that is higher by at least 5% or more than the spin torque switching efficiency of a similar device made without hydrogen treatment, and in some embodiments the MRAM device has a spin torque switching efficiency of at least 0.5 or more. In some embodiments the MRAM device has hydrogen atoms incorporated in a portion of the magnetic tunnel junction at a concentration range of about 10 ppm to about 10%, based on the total number of atoms in the magnetic tunnel junction, and in some embodiments the hydrogen atoms are distributed in each layer of the magnetic tunnel junction.

In some embodiments the MRAM device can undergo further processing. The further processing can include embedding the encapsulated device into the back-end-of-line (BEOL) of a CMOS process route. The encapsulated device may undergo additional processing after the BEOL of the CMOS route.

EXAMPLES

Example 1

Figure 7:
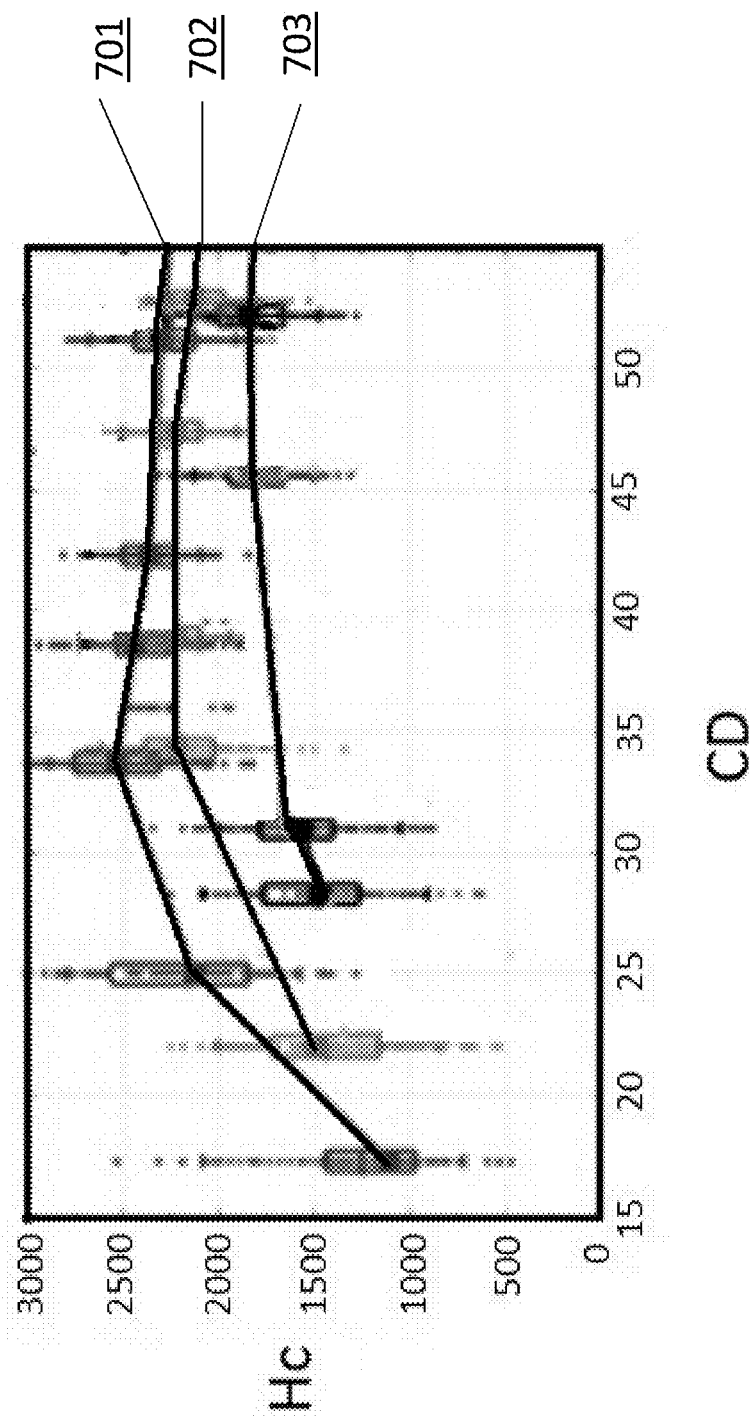
FIG. 7 is a graph illustrating coercivity (Hc) vs critical dimension (CD) for an MRAM device prepared by methods including hydrogen plasma treatment.

FIG. 7 is a graph illustrating MRAM devices and their coercivity measurements. The graph shows coercivity ($H_c$) ($O_e$) as a function of CD (nm) (critical dimension (CD) measured by transmission electron microscopy (TEM)).

Trace 701 shows coercivity of an MRAM device that was made by methods using a hydrogen plasma treatment, followed by encapsulation with a silicon nitride layer that was made using PVD methods. For comparison, trace 702 shows coercivity of a device that was made using the hydrogen plasma treatment, followed by encapsulation with a silicon nitride layer that was made using PECVD methods, and trace 703 shows coercivity of a device made without exposure to hydrogen plasma.

Example 2

Figure 8:
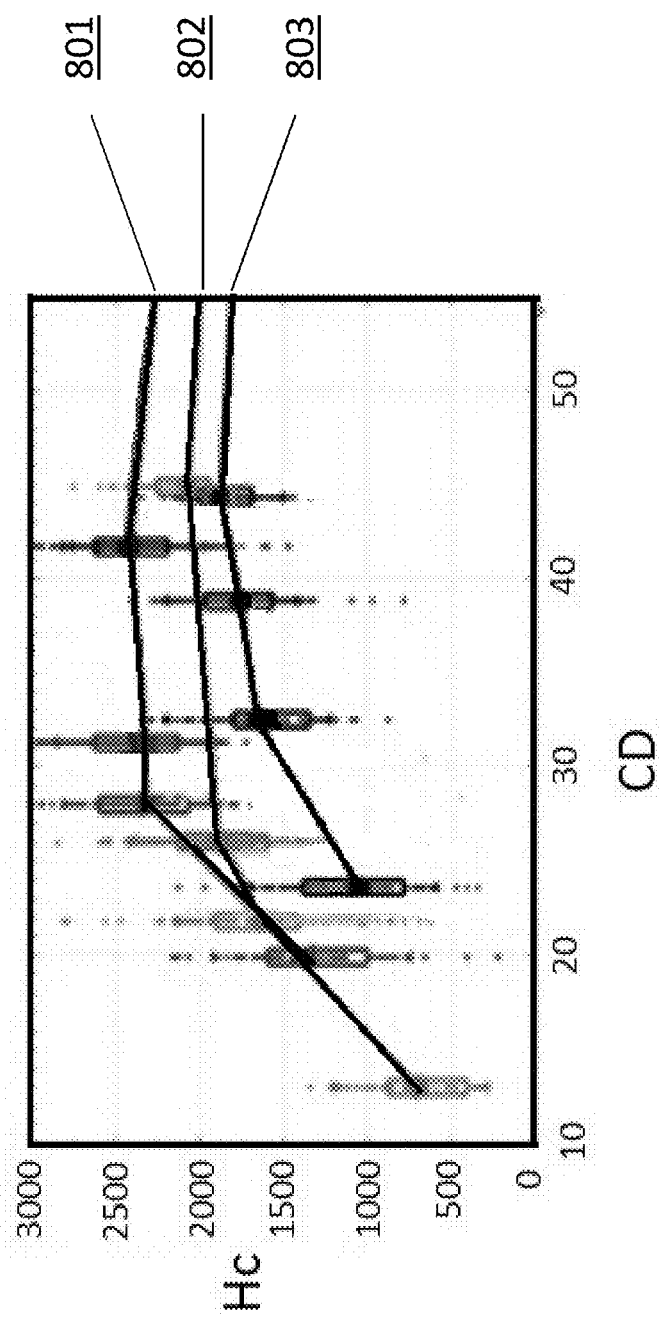
FIG. 8 is a graph illustrating coercivity (Hc) vs critical dimension (CD) for another MRAM device prepared by methods including hydrogen plasma treatment.

FIG. 8 is a graph illustrating coercivity ($H_e$) vs critical dimension (CD) for additional MRAM devices. The graph shows coercivity ($H_e$) (Oe) as a function of CD (nm) (critical dimension (CD) measured by transmission electron microscopy (TEM)).

Trace 801 shows coercivity of an MRAM device that was made by methods using a hydrogen plasma treatment, followed by encapsulation with a silicon nitride layer that was made using PVD methods. For comparison, trace 802 shows coercivity of a device that was made using the hydrogen plasma treatment, followed by encapsulation with a silicon nitride layer that was made using PECVD methods, and trace 803 shows coercivity of a device made without exposure to hydrogen plasma.

Example 3

Table 1 below illustrates $H_c$ (Oe) for CD sizes of 10 nm and 35 nm for MRAM devices prepared with and without hydrogen plasma treatment. The data show the benefit of the hydrogen plasma treatment for increasing the $H_c$ values at both the 10 nm and 35 nm CD sizes. The process wherein hydrogen plasma treatment is followed by encapsulation by a PVD method is particularly advantageous.

TABLE 1

| $H_c$ (Oe) for CD sizes of 10 nm and 35 nm | | |
| --- | --- | --- |
| Process | $H_c$ @ 10 nm CD | $H_c$ @ 35 nm CD |
| PECVD/no hydrogen | 1343.8 | 1692 |
| PVD/hydrogen plasma | 1718.8 | 2506 |
| PECVD/hydrogen plasma | 1593.8 | 2219 |

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:
   forming a magnetic tunnel junction on an electrode, the magnetic tunnel junction comprising a reference layer positioned in contact with the electrode, a tunnel barrier layer arranged on the reference layer, and a free layer arranged on the tunnel barrier layer;
   depositing an encapsulating layer on and along sidewalls of the magnetic tunnel junction;
   depositing an interlayer dielectric layer on the encapsulating layer disposed on the magnetic tunnel junction;
   annealing the magnetic tunnel junction; and
   implanting hydrogen in a portion of the magnetic tunnel junction.

2. The method of claim 1, wherein implanting hydrogen in the magnetic tunnel junction occurs at a power in a range from about 25 to about 200 kiloelectronvolts (keV).

3. The method of claim 1, wherein implanting occurs at a temperature range from about −20 to about 250° C.

4. The method of claim 1, wherein implanting occurs with a hydrogen dose from about $1\times10^{13}$ to about $1\times10^{18}$ cm$^{-2}$.

5. The method of claim 1, wherein implanting occurs with a hydrogen dose rate from about $1\times10^{11}$ to about $1\times10^{15}$ cm$^{-2}$s$^{-1}$.

6. The method of claim 1, wherein implanting further comprises implanting with non-hydrogen ions prior to implanting with hydrogen; wherein the non-hydrogen ions can be neon ions.

7. The method of claim 1, wherein depositing an encapsulating layer is performed using chemical vapor deposition.

8. The method of claim 7, wherein the chemical vapor deposition is plasma enhanced chemical vapor deposition.

9. The method of claim 8, wherein the chemical vapor deposition is performed at a temperature range from about 100 to about 250° C.

10. The method of claim 1, wherein depositing an encapsulating layer is performed using physical vapor deposition.

11. The method of claim 10, wherein the physical vapor deposition is performed at a temperature range from about 20 to about 25° C., or at room temperature.

12. The method of claim 1, wherein the encapsulating layer comprises silicon nitride, aluminum oxide, or a combination thereof.

13. The method of claim 1, wherein the MRAM device is a spin torque transfer MRAM (STT-MRAM) device.

14. A method of making a magnetic random access memory device, the method comprising:
   forming a magnetic tunnel junction on an electrode, the magnetic tunnel junction comprising a reference layer positioned in contact with the electrode, a tunnel barrier layer arranged on the reference layer, and a free layer arranged on the tunnel barrier layer;
   depositing an encapsulating layer on and along sidewalls of the magnetic tunnel junction;
   depositing an interlayer dielectric layer on the encapsulating layer disposed on the magnetic tunnel junction;
   annealing the magnetic tunnel junction;
   forming a trench through a portion of the encapsulating layer and interlayer dielectric layer, said trench exposing a portion of the free layer; and
   implanting hydrogen in a portion of the magnetic tunnel junction after forming the trench.

15. The method of claim 14, wherein the encapsulating layer comprises silicon nitride and depositing the encapsulating layer comprises a physical vapor deposition or chemical vapor deposition process.

16. The method of claim 14, wherein implanting hydrogen in the magnetic tunnel junction occurs at a power in a range from about 25 to about 200 kiloelectronvolts (keV).

17. The method of claim 14, wherein implanting occurs at a temperature range from about −20 to about 250° C.

18. The method of claim 14, wherein implanting occurs with a hydrogen dose from about $1\times10^{13}$ to about $1\times10^{21}$ cm$^{-2}$.

19. The method of claim 14, wherein implanting occurs with a hydrogen dose rate from about $1\times10^{11}$ to about $1\times10^{15}$ cm$^{-2}$s$^{-1}$.

20. An MRAM device comprising: a magnetic tunnel junction arranged on an electrode, the magnetic tunnel junction comprising a reference layer positioned in contact with the electrode, a tunnel barrier layer arranged on the reference layer, and a free layer arranged on the tunnel barrier layer;
   an encapsulating layer disposed on and along sidewalls of the magnetic tunnel junction; and
   an interlayer dielectric layer disposed on the encapsulating layer; wherein
   hydrogen atoms are incorporated in a portion of the magnetic tunnel junction at a concentration range from about 10 ppm to about 10% based on the total number of atoms in the magnetic tunnel junction.

* * * * *